(12) United States Patent
Ishii

(10) Patent No.: US 7,709,957 B2
(45) Date of Patent: May 4, 2010

(54) SEMICONDUCTOR DEVICE

(75) Inventor: Kenichi Ishii, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 12/351,084

(22) Filed: Jan. 9, 2009

(65) Prior Publication Data
US 2009/0174074 A1 Jul. 9, 2009

(30) Foreign Application Priority Data
Jan. 9, 2008 (JP) .............................. 2008-001864

(51) Int. Cl.
 H01L 23/48 (2006.01)
 H01L 23/52 (2006.01)
 H01L 29/40 (2006.01)
(52) U.S. Cl. ...................................... 257/758; 257/781
(58) Field of Classification Search ................. 257/753, 257/750, 758, 782, 783, 780, 781, 784
See application file for complete search history.

(56) References Cited

U.S. PATENT DOCUMENTS 5,789,809 A   8/1998   Joshi
6,597,070 B2 * 7/2003 Miyazaki ................... 257/778
6,624,522 B2   9/2003 Standing et al.
2002/0041013 A1 * 4/2002 Wakamiya et al. .......... 257/678
2004/0195687 A1 * 10/2004 Inoue et al. ................. 257/738
2009/0130840 A1 * 5/2009 Wang et al. ................. 438/614
2009/0224409 A1 * 9/2009 Miyata et al. ............... 257/774
2009/0227714 A1 * 9/2009 Kawakami et al. .......... 524/114
2009/0283877 A1 * 11/2009 Tsai et al. ................... 257/659

FOREIGN PATENT DOCUMENTS

| JP | 06-077231 | 3/1994 |
| JP | 2000-021914 | 1/2000 |
| JP | 2000-228423 | 8/2000 |
| JP | 2000-299343 | 10/2000 |

* cited by examiner

Primary Examiner—S. V Clark
(74) Attorney, Agent, or Firm—Young & Thompson (57) ABSTRACT

The present invention provides a semiconductor device exhibiting an improved reliability of a bump coupling section. A semiconductor device is provided, which comprises: an interconnect layer; a stress-relaxing layer, covering the interconnect layer and provided with an opening exposing at least a portion of the interconnect layer; a post, covering the opening and provided so as to overlap with the stress-relaxing layer disposed around the opening; and a resin layer, provided around the post to cover the stress-relaxing layer, wherein a value of 2A/C is within a range of from 0.1 to 0.5, wherein C is a diameter of the post and 2A is a width of an overlapping region of the stress-relaxing layer with the post.

10 Claims, 6 Drawing Sheets

SEMICONDUCTOR DEVICE

The present application is based on Japanese patent application No. 2008-001,864, the content of which is incorporated hereinto by reference.

BACKGROUND

1. Technical Field

The present invention relates to a semiconductor device.

2. Related Art

Typical structures of conventional semiconductor chips includes a structure, in which an electrode provided on a semiconductor chip is connected to a terminal lead disposed in a periphery of a package via a wire bonding, and an encapsulating resin is employed to create a packaging thereof. Since reduced spacing between terminal leads due to increased number of terminals disposed in a semiconductor chip allow installing only limited number of elements in a substrate in the packaging having such structure, a problem of a difficulty in avoiding an increased size of the package for maintaining a required dimension of the spacing between the terminal leads is arisen. In order to solve such problem, a type of a chip including a bonding member employing a solder and a bump such as a package called a chip size package is proposed.

Figure 6:
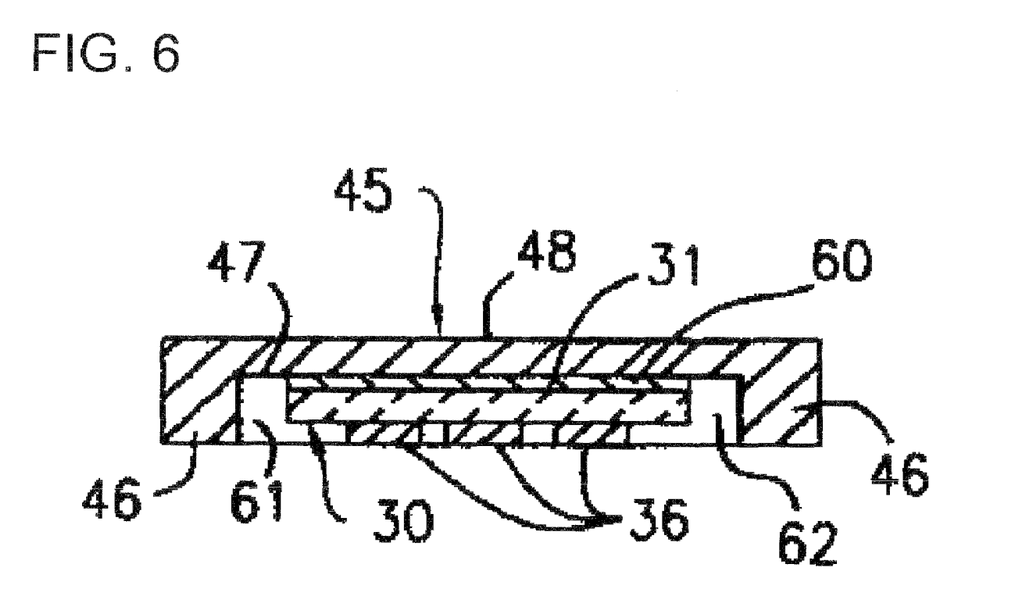
FIG. 6 is a schematic diagram, illustrating a conventional semiconductor device.

Typical compact package for a metal oxide semiconductor field effect transistor (MOSFET) includes a package described in U.S. Pat. No. 6,624,522. Such package is shown in FIG. 6. The package shown in FIG. 6 includes a U-shaped clip 45, a die 30 having a silicon body 31 and a contact post 36, and the clip 45 includes a web 48 having a plated inner surface 47 and legs 46. The silicon body 31 is coupled to an inner surface 47 via an electroconductive adhesive agent 60 so as to leave gaps 61 and 62 with the side surfaces of the legs 46 facing the side edges of the die 30.

U.S. Pat. No. 5,789,809 discloses a typical ball grid array (BGA) package for MOSFET. Japanese Patent Laid-Open No. 2000-21,914 and Japanese Patent Laid-Open No. H06-77,231 (1994) typically disclose semiconductor devices, which includes a passivating film, an under bump metal (UBM) and a gold (Au) bump that are provided on an aluminum (Al) pad, and is configured that the passivating film overlaps with the UBM and the Au bump. Japanese Patent Laid-Open No. 2000-299,343 discloses a semiconductor device, in which solder bumps are directly installed in a surface of a device to provide a coupling with a printed circuit board. Japanese Patent Laid-Open No. 2000-228,423 discloses a semiconductor device, comprising a metal post provided on an interconnect layer formed on a polyimide film, a barrier layer provided on the metal post and solder balls provided on the barrier layer.

Figure 5:
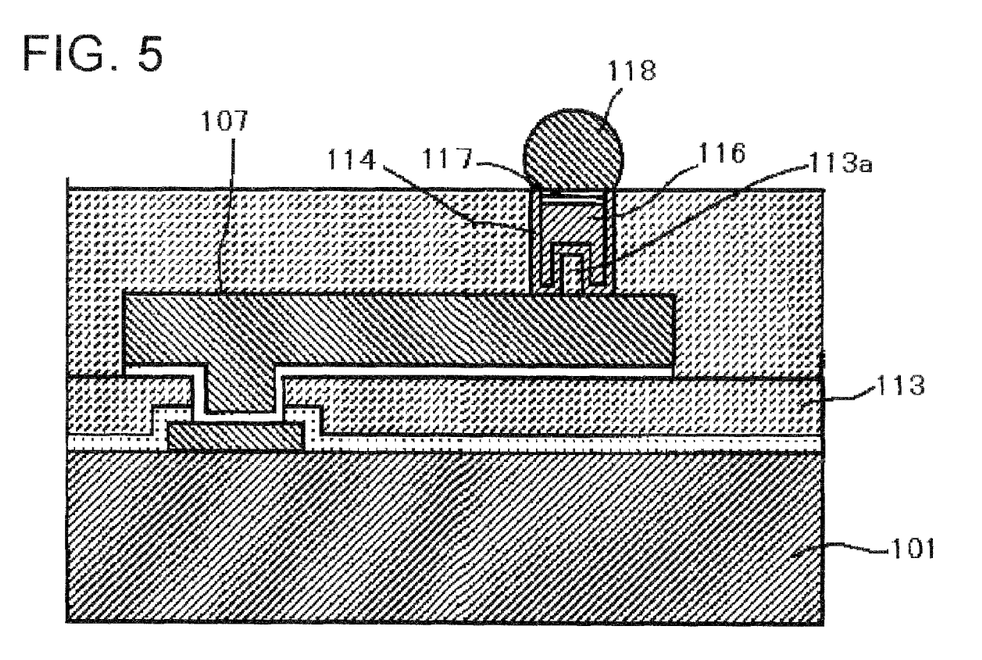
FIG. 5 is a schematic diagram, illustrating a conventional semiconductor device.

In the conventional semiconductor device including the metal post typically disclosed in Japanese Patent Laid-Open No. 2000-228,423, an electrode provided on a semiconductor substrate 101 is coupled to an end of an electrode layer 107 formed on a polyimide film 113 and a metallic post 116 is formed in another end of the electrode layer 107, as shown in FIG. 5. In the semiconductor device disclosed in Japanese Patent Laid-Open No. 2000-228,423, the metal post 116 is formed via a columnar polyimide layer 113a and an electrode layer 114 for plating. Therefore, a polyimide layer is present under the metal post 116. A solder ball 118 is provided on the metal post 116 via the barrier layer 117.

When a semiconductor chip (Si) is flip-installed on a base substrate (organic material), differences in thermal expansion coefficient among the base substrate (organic material), solder (Sn) and the semiconductor chip (Si) cause thermal stresses in interfaces therebetween. When an interconnect layer is formed on a polyimide film and a metal post is further formed on the interconnect layer as disclosed in Japanese Patent Laid-Open No. 2000-228,423, the presence of the polyimide film reduces the stress. However, the MOSFET for power applications requires forming the UBM and the metal post on an aluminum (Al) interconnect (typically source pad) for achieving a miniaturization and an increased current capacity. In other words, the structure having the interconnect layer drawn on the polyimide film as disclosed in Japanese Patent Laid-Open No. 2000-228,423 is detrimental for both the miniaturization and the increase in the current capacity, and thus is not adopted. Results of the study by the present inventors show that, when the UBM and the copper (Cu) post are directly connected to the Al interconnect, an absence of a material such as a polyimide film that is capable of reducing the stress causes a propagation of thermal stresses created among the base substrate (organic material), solder (Sn) and the semiconductor chip (Si) without being relaxed, generating a crack in the Al interconnect, and the generated crack extends to the silicon material (Si).

For example, a thermal expansion coefficient of a copper (Cu) electroconductive cap is 17 ppm/degree C., that of a silicon semiconductor chip is 3 ppm/degree C., that of lead-free solder is 22 ppm/degree C., and that of a glass epoxy board (mother board) is 20 ppm/degree C. Larger difference in thermal expansion coefficient between the employed materials provides easier generation of cracks In addition, it is necessary to provide an improved life of a soldered joint. Thus, it is considered that an increased diameter of the Cu post or an increased height of the Cu post provide an effect for an enhanced life of the soldered joint. However, the present inventors have found a trend that such configuration would provide an increased stress in the coupling interface with the UBM and the Al interconnect.

Therefore, the present inventors consider providing further improved reliability in the bump coupling section.

SUMMARY

According to one aspect of the present invention, there is provided a semiconductor device, comprising: an interconnect layer; a stress-relaxing layer, covering the interconnect layer and provided with an opening exposing at least a portion of the interconnect layer; a post, covering the opening and provided so as to overlap with the stress-relaxing layer disposed around the opening; and a resin layer, provided around the post to cover the stress-relaxing layer, wherein a value of 2A/C is within a range of from 0.1 to 0.5, wherein C is a diameter of the post and 2A is a width of an overlapping region of the stress-relaxing layer and the post.

In such semiconductor device, the post covers the opening and the stress-relaxing layer, and is disposed so that the relation of the diameter of the post with the overlapping region satisfies the above-described relation. This allows a thermal stress exerted during the installation to the substrate being dispersed to the stress-relaxing layer, thereby reducing the thermal stress exerted over the interconnect layer. Therefore, the semiconductor device exhibiting an improved reliability of the bump coupling section can be achieved without generating a crack in the interconnect layer.

According to the present invention, the semiconductor device exhibiting an improved reliability of the bump coupling section can be achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Semiconductor devices of the present invention and a process for manufacturing thereof will be described in detail as follows in reference to the annexed figures. In all figures, an identical numeral is assigned to an element commonly appeared in the figures, and the detailed description thereof will not be repeated.

First Embodiment

Figure 1:
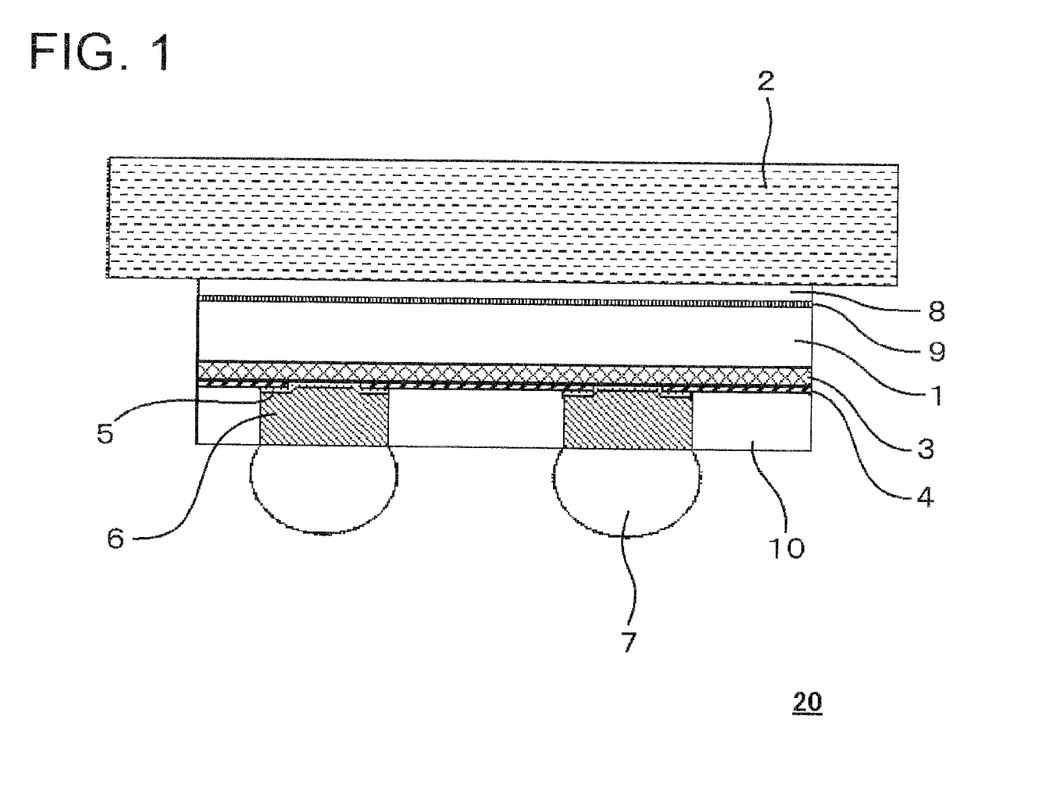
FIG. 1 is a cross-sectional view of a semiconductor device in first embodiment of the present invention.

FIG. 1 is a cross-sectional view of a semiconductor device of an embodiment of the present invention. A semiconductor device 20 includes an interconnect layer (Al interconnect) 3, a stress-relaxing layer 4 and posts 6. In the present embodiment, the semiconductor device 20 includes a semiconductor chip 1. The chip 1 includes a gate electrode (not shown) and a source electrode (not shown) in the surface in the side coupled to the base substrate (not shown), and a drain electrode (not shown) in a back surface thereof. A back surface metal 9 of the drain electrode is coupled through a solder 8 to an electroconductive cap 2. When the electroconductive cap 2 is employed for an electrode that electrically couples the drain electrode formed in the back surface of the chip 1 with a base substrate (not shown), legs 46 illustrated in FIG. 6 (not shown in FIG. 1) may be preferably provided. A stress-relaxing layer 4 having array-like openings are provided over the gate electrode and an interconnect layer (Al interconnect) 3 of the source electrode. The stress-relaxing layer 4 has an opening that exposes at least a portion of the Al interconnect layer 3, and is formed so as to cover such Al interconnect layer 3. An UBM layer 5 is provided on the stress-relaxing layer 4 so as to cover such opening and overlap with the stress-relaxing layer 4 around the opening, and the Cu posts 6 are provided on the UBM layer 5. In the present embodiment, the diameter of the UBM layer 5 is same as the diameter of the Cu post 6. An epoxy resin layer 10 covers the space between the Cu posts. A solder ball 7 is mounted on each of the Cu post 6.

The semiconductor device having the solder balls 7 installed thereto is bump-joined to the base substrate to serve as a semiconductor device.

Figure 2:
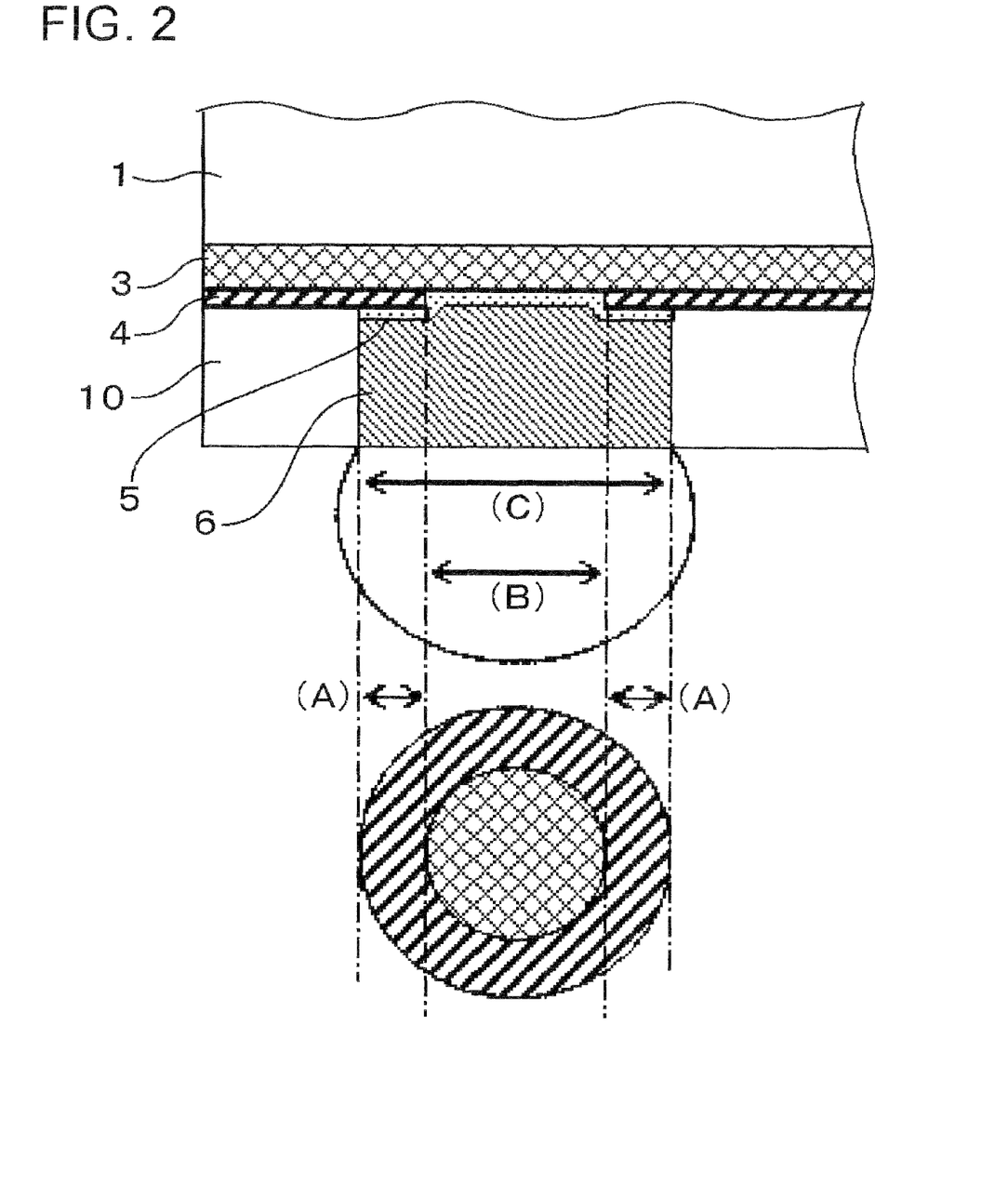
FIG. 2 is a schematic diagram of the semiconductor device in first embodiment of the present invention.

A process for manufacturing the semiconductor device will be described in reference to a schematic diagram of a semiconductor device of the present embodiment shown in FIG. 2. The semiconductor chip 1 includes a MOSFET (not shown) and an interlayer insulating films (not shown) formed therein, and further includes the Al interconnect layer 3 thereon First of all, the stress-relaxing layer 4 covering the entire Al interconnect layer 3 is formed via a chemical vapor deposition (CVD) process The stress-relaxing layer 4 thus formed in this way is patterned to provide the openings having a diameter (B) to be, for example, array-like. Subsequently, the UBM layer 5 is formed via a sputter process or the like so as to cover the entire stress-relaxing layer 4 having the openings. Typical materials available for the UBM layer 5 include titanium (Ti), copper (Cu) or nickel (Ni), or an alloy thereof. Thereafter, a dry film having an opening (not shown) is preliminarily adhered to a region on the UBM layer 5 for forming the Cu post 6. Then, the Cu posts 6 are formed on the UBM layer 5 via an electric field plating process Thereafter, the dry film is torn off, and the UBM layer 5 is etched through a mask of the Cu posts 6 to remove the excessive UBM layer 5. This allows the UBM layer 5 being formed to have the same shape of the Cu post 6. Thereafter, the epoxy resin layer 10 is formed so as to cover the Al interconnect layer 3, the stress-relaxing layer 4, the UBM layer 5 and the Cu posts 6. Then, the epoxy resin layer 10 is polished to create expose surfaces of the Cu posts 6 out of the epoxy resin layer 10. Therefore, the exposed surfaces of the Cu posts 6 and the surface of the epoxy resin layer 10 are substantially coplanar. Then, the solder balls 7 are formed on the Cu posts 6.

In such way, the circular UBM layer 5 having a diameter (C) is remained over the opening of the stress relaxing layer 4. FIG. 2 schematically exemplifies a case that the Cu post 6 overlaps with the stress-relaxing layer 4 having an opening dimension B in a concentric relation, provided for the purpose of simplify the description, and the UBM layer 5 having such diameter (C) covers over the opening having the diameter (B) and has a dimension for overlapping with the stress-relaxing layer 4 around the opening by the width (A). More specifically, the relation of the following formula (1) is satisfied:

$$C = B + 2 \times A \qquad \text{formula (1)}$$

Here, the stress-relaxing layer serves as a layer that allows reducing the thermal stress in mounting thereof to the semiconductor substrate of the semiconductor device. Materials employed for the stress-relaxing layer 4 may preferably be softer than Si or Cu and harder than resins such as polyimide and the like, and have a thermal expansion coefficient that is intermediate between Si and Cu. Since such material is difficult to be thermally deformed and is moderately soft, the material can function as a cushioning material between the UBM layer 5 and the Al interconnect 3. In addition to above, a temperature in the solder mounting process may ordinarily be 220 degree C. to 260 degree C.

Here, thermal expansion coefficients of the respective materials at temperatures ranging from a room temperature to a mounting temperature are shown in table 1. A material having a thermal expansion coefficient that is intermediate between Si and Cu is preferably employed for the stress-relaxing layer 4. A material having a thermal expansion coefficient of within a range of from 5 ppm/degree C. to 10 ppm/degree C. and a Young's modulus of within a range of from 30 GPa to 100 GPa may be preferably employed for such material, as shown in the following table 1. The materials satisfying the above-described conditions typically include phosphosilicate glass (PSG) and borophosphosilicate glass (BPSC). Phosphosilicate glass and borophosphosilicate glass exhibit a thermal expansion coefficient of 8 ppm/degree C. and Young's modulus of 65 GPa. The stress-relaxing layer 4 may be composed of a single layer of BPSG or PSG, or alternatively composed of composite layers composed of a combination thereof.

| ITEMS | Si | POLYIMIDE | STRESS-RELAXING LAYER 4 | Cu |
|---|---|---|---|---|
| YOUNG'S MODULUS [GPa] | 192 | 3 | 30~100 | 125 |
| THERMAL EXPANSION COEFFICIENT [ppm/° C.] | 4 | 20 | 5~10 | 17 |

Figure 3:
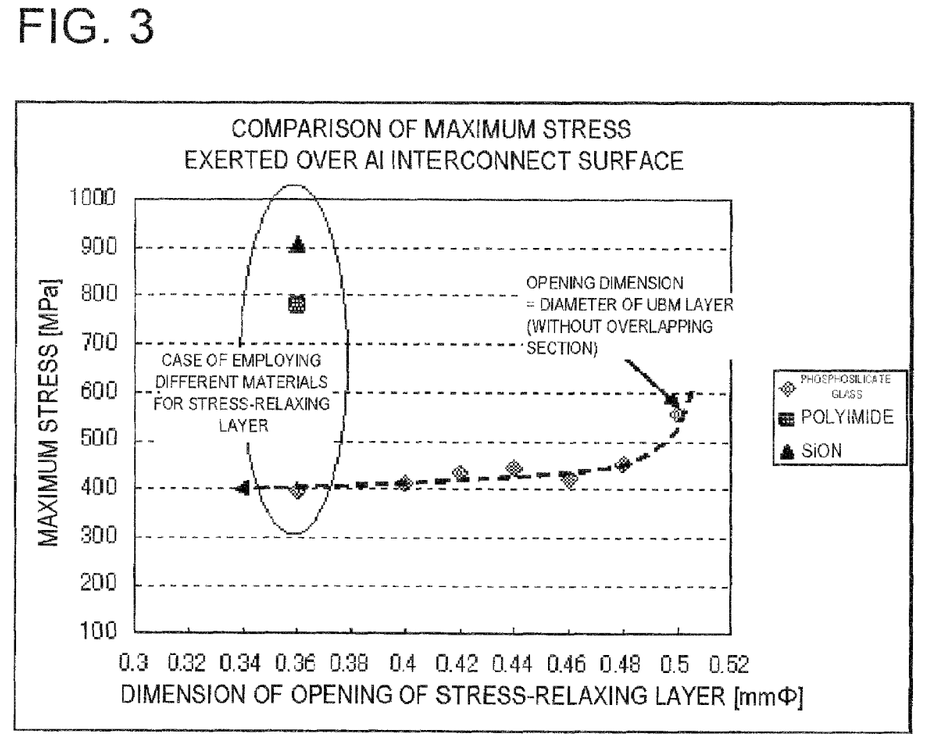
FIG. 3 is a graph, showing a relation of the opening dimension of the stress-relaxing layer with the maximum stress exerted over the Al interconnect layer.

FIG. 3 shows maximum stresses exerted over the Al interconnect layer 3 in the conditions that the diameter (C) of the UBM layer 5 and the diameter (C) of the Cu post 6 is selected to be 0.5 mm, the opening dimension (B) of the stress-relaxing layer 4 is selected to be 0.36 mm, and phosphosilicate glass, borophosphosilicate glass, polyimide or SiON is employed for the stress-relaxing layer 4. As can be seen from FIG. 3, when phosphosilicate glass or borophosphosilicate glass is employed for the stress-relaxing layer 4, the stress exerted over the Al interconnect layer 3 is most reduced. FIG. 3 additionally shows a relation of the simulation result of maximum stress exerted over the Al interconnect layer with the opening dimension of the stress-relaxing layer 4 (B), in the conditions that the diameter of the UBM layer 5 and the diameter of the Cu post 6 (C) are selected to be 0.5 mm and phosphosilicate glass or borophosphosilicate glass is employed for the stress-relaxing layer 4. It can be seen from the graph of FIG. 3 that larger dimension 2A of the overlapping section between the stress-relaxing layer 4 and the Cu post 6 (2A=C−B) provides lower the maximum stress exerted over the Al interconnect layer 3. According to the results shown in FIG. 3, the dimension 2A of the overlapping section is set to be around 10% of the diameter C, so that the maximum stress exerted over the Al interconnect layer 3 can be reduced by about 25%, as compared with the case that the overlapping section is not provided. In addition to above, it is empirically found that no breakdown right under the Cu post 6 occurs when the maximum stress is lower than 500 MPa.

In the present embodiment, the value of 2A/C is preferably within a range of from 0.1 to 0.5, more preferably within a range of from 0.1 to 0.4, and further preferably within a range of from 0.1 to 0.2. If the above-described value is not lower than 0.1, sufficient relaxation for the stress in mounting is achieved, and If not higher than 0.5, sufficiently lower resistance between the Cu post and the Al interconnect layer is maintained.

In the present embodiment, the dimension 2A of the overlapping section between the stress-relaxing layer 4 and the Cu post 6 is preferably 50 μm to 200 μm, and more preferably 50 μm to 100 μm. However, the optimum value of A also depends upon the type of material for the stress-relaxing layer 4 or the diameter of the UBM layer 5. In addition to above, the exemplary implementation of the Cu post 6 overlapping in concentric relation with the stress-relaxing layer 4 having the opening dimension B is illustrated in the present embodiment, the adhered position of the dry film is ordinarily misaligned with the opening of the stress-relaxing layer 4, the center of the Cu post 6 is also misaligned with the center of the opening of the stress-relaxing layer 4. In such case, it may be considered that (Amin+Amax) is replaced with the above-described 2A where the minimum dimension and the maximum dimension of the overlapping section are Amin and Amax, respectively. In addition, the exemplary implementation of the UBM layer 5 having substantially the same geometry with the Cu post 6 is illustrated in the present embodiment, the patterning may alternatively be conducted so that the UBM layer 5 is wider than the Cu post 6. While the epoxy resin layer 10 is employed in the present embodiment, other type of thermosetting resins such as polyimide resin and the like may also be employed.

Second Embodiment

Figure 4:
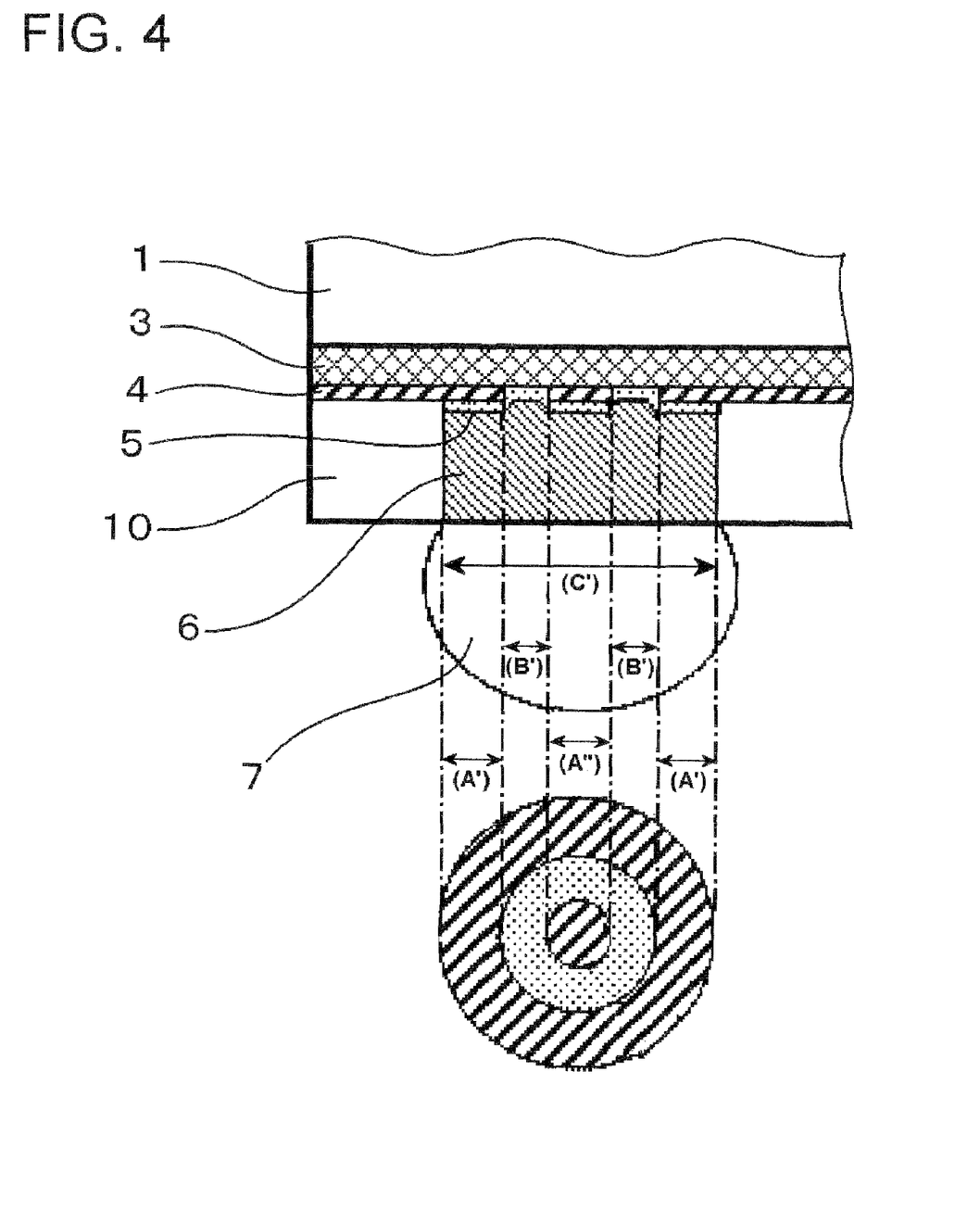
FIG. 4 is a schematic diagram of a semiconductor device in second embodiment of the present invention.

FIG. 4 schematically shows a semiconductor device of the present embodiment. The configuration of the semiconductor device in the present embodiment is similar to that of first embodiment, except that the UBM layer 5 and the Cu post 6 are provided over a plurality of openings of the stress-relaxing layer 4.

In the present embodiment, (A') represents the dimension of the overlapping section of the outside of the Cu post 6 with the stress-relaxing layer 4, (A") represents the dimension of the overlapping section in the center section, (B') represents the diameter of the opening, and (C') represents the diameter of the Cu post 6.

In the present embodiment, the value of (2×A'+A")/C' is preferably within a range of from 0.1 to 0.5, more preferably within a range of from 0.1 to 0.4, and further preferably within a range of from 0.1 to 0.2. Here, $$C'=2\times A'+A''+2\times B'.$$

In the present embodiment, for example, the diameter (C') of the Cu post 6 may be selected to be 500 μm, the dimension (A') of the outer overlapping section may be selected to be 25 μm, and the dimension (A") of the overlapping section in the center may be selected to be 50 μm. In addition to above, if the center of the Cu post 6 is misaligned with the center of the opening of the stress-relaxing layer 4 in the present embodiment, it is preferable to consider similarly as in first embodiment.

While the preferred embodiments of the present invention have been described above in reference to the annexed figures, it should be understood that the disclosures above are presented for the purpose of illustrating the present invention, and the configurations except the above-described configuration may also be adopted. For example, while the description is made on the exemplary implementation of the semiconductor device 20 provided with the electroconductive cap 2, the present invention may also be applied to the case that no electroconductive cap 2 is included. In addition, while the description is made on the exemplary implementation of the semiconductor device 20 coupled to the base substrate, the present invention may also be applied to the case that the semiconductor device is joined via a bump to the semiconductor device having the same thermal expansion coefficient.

It is apparent that the present invention is not limited to the above embodiment, and may be modified and changed without departing from the scope and spirit of the invention.

What is claimed is:

1. A semiconductor device, comprising:
   an interconnect layer;

a stress-relaxing layer, covering said interconnect layer and provided with an opening exposing at least a portion of said interconnect layer;

a post, covering said opening and provided so as to overlap with the stress-relaxing layer disposed around said opening; and a resin layer, provided around said post to cover said stress-relaxing layer, wherein a value of 2A/C is within a range of from 0.1 to 0.5, wherein C is a diameter of said post and 2A is a width of an overlapping region of said stress-relaxing layer with said post.

2. The semiconductor device according to claim 1, further comprising an under-bump metal layer between said opening and said post and between said stress-relaxing layer and said post.

3. The semiconductor device according to claim 2, wherein said under-bump metal layer contains at least one selected from a group consisting of titanium (Ti), copper (Cu) and nickel (Ni).

4. The semiconductor device according to claim 1, wherein said post contains copper (Cu).

5. The semiconductor device according to claim 1, further comprising a solder ball provided on said post.

6. The semiconductor device according to claim 1, wherein said stress-relaxing layer has a thermal expansion coefficient of within a range of from 5 ppm/degree C. to 10 ppm/degree C. and a Young's modulus of within a range of from 30 GPa to 100 GPa.

7. The semiconductor device according to claim 6, wherein said stress-relaxing layer includes at least one selected from the group consisting of phosphosilicate glass (PSG) and borophosphosilicate glass (BPSG).

8. The semiconductor device according to claim 1, wherein the value of 2A is within a range of from 50 μm to 200 μm.

9. The semiconductor device according to claim 1, further comprising an electroconductive cap, wherein said electroconductive cap is provided in a side of said semiconductor device opposite to the side having said post formed therein.

10. The semiconductor device according to claim 1, wherein said resin layer covers the side wall of said post, and wherein a surface of said post opposite to the side of said interconnect layer and a surface of said resin layer opposite to the side of said interconnect layer is coplanar.

* * * * *